(12) United States Patent
Ma et al.

(10) Patent No.: US 7,378,289 B1
(45) Date of Patent: May 27, 2008

(54) METHOD FOR FORMING PHOTOMASK HAVING TEST PATTERNS IN BLADING AREAS

(75) Inventors: Zhijian Ma, Cupertino, CA (US);
Pao-Lu Huang, San Jose, CA (US);
Pauli Hsueh, San Jose, CA (US);
Jeong Choi, Palo Alto, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 371 days.

(21) Appl. No.: 11/100,144

(22) Filed: Apr. 5, 2005

(51) Int. Cl.
*H01L 21/00* (2006.01)
*H01L 21/66* (2006.01)

(52) U.S. Cl. ............................ 438/14; 438/11; 438/16; 257/E21.023

(58) Field of Classification Search ................... 438/11, 438/18, 74, 14, 16; 257/E21.023
See application file for complete search history.

(56) References Cited

U.S. PATENT DOCUMENTS

| | | |
|---|---|---|
| 5,705,299 A | 1/1998 | Tew et al. |
| 6,037,087 A | 3/2000 | Pierrat et al. |
| 6,040,892 A | 3/2000 | Pierrat |
| 6,146,908 A | 11/2000 | Falque et al. |
| 6,855,997 B2 * | 2/2005 | Suwa .............................. 430/5 |
| 6,967,111 B1 * | 11/2005 | Hata ............................ 438/11 |
| 7,223,616 B2 * | 5/2007 | Duan et al. .................... 438/18 |
| 2002/0076840 A1 * | 6/2002 | Englisch ....................... 438/14 |
| 2002/0081501 A1 * | 6/2002 | Hasegawa et al. ............. 430/5 |
| 2003/0039928 A1 | 2/2003 | Bollinger et al. |
| 2003/0129509 A1 * | 7/2003 | Yamaguchi ................... 430/30 |
| 2004/0229388 A1 * | 11/2004 | Guldi et al. ................... 438/14 |
| 2004/0268272 A1 * | 12/2004 | Farrow et al. ................. 716/1 |

* cited by examiner

*Primary Examiner*—Scott B. Geyer
*Assistant Examiner*—Seahvosh Nikmanesh
(74) *Attorney, Agent, or Firm*—Kenneth Glass; Glass & Associates

(57) ABSTRACT

A photomask and a method for forming a photomask are disclosed in which die regions that define features for a process step of a semiconductor fabrication process are formed on a photomask and a test pattern for a different process step is formed in a blading area of the photomask. Also, a method for forming test structures is disclosed in which the photomask is exposed to transfer the test pattern to a semiconductor substrate. The process step that is associated with the test pattern is then performed, forming a test structure on the semiconductor substrate. By utilizing blading areas of photomasks and including test patterns for different process steps on the same photomask, more test structures can be obtained, without the need to generate additional photomasks for testing purposes.

18 Claims, 8 Drawing Sheets

METHOD FOR FORMING PHOTOMASK HAVING TEST PATTERNS IN BLADING AREAS

FIELD OF THE INVENTION

The present invention relates to the field of semiconductor devices. More specifically, the present invention relates to semiconductor device fabrication processes and methods for testing semiconductor devices.

BACKGROUND ART

In conventional integrated circuit fabrication processes an integrated circuit layout design is generated that includes multiple layers of design data. The integrated circuit layout design is then sent to a photomask vendor who generates photomasks that are to be used in the subsequent fabrication process. More particularly, each layer of design data is converted into a single photomask that includes multiple die regions that include the design features indicated by the layout design. Portions of the photomask that are outside of the die regions, typically referred to as "blading areas," extend on all four sides of each photomask. These blading areas are typically left blank and are covered during the exposure process by blades.

During the integrated circuit manufacturing process semiconductor wafers are subjected to numerous process steps, with each process step performed sequentially on a particular semiconductor wafer. Conventionally, for each process step that requires patterning, a single photomask is used to transfer the pattern to individual semiconductor wafers.

With technologies moving to ever smaller feature sizes, integrated circuit designs and manufacturing processes have become increasingly complex. As a result there has been a growing need to test integrated circuit designs and manufacturing processes. Conventionally, test patterns are taped out to scribe lines located between die regions. However, scribe lines are long and thin, limiting the number of test patterns that can be formed on each photomask. Moreover, it is impractical to purchase additional photomasks for testing because of the high cost of photomasks. Accordingly, there is a need for a method for forming test structures on semiconductor substrates that does not require taping out test structures to scribe lines. Moreover, there is a need for a method for forming test structures on semiconductor substrates that does not increase the number of photomasks. The present invention meets the above needs.

DISCLOSURE OF THE INVENTION

A photomask and a method for forming a photomask are disclosed in which die regions that define features for a process step of a semiconductor fabrication process are formed on a photomask. A test pattern for a different process step is formed in a blading area of the photomask. The photomask is exposed to transfer the test pattern to a semiconductor substrate and the different process step is performed, forming a test structure on the semiconductor substrate. This test structure can be formed on a production wafer or can be formed on a dedicated test wafer.

By utilizing blading areas of photomasks and including test patterns that are not associated with the same process step that the photomask is associated with, the methods and apparatus of the present invention allow for more test structures to be obtained, without adding additional photomasks to the fabrication process. These and other advantages of the present invention will no doubt become obvious to those of ordinary skill in the art after having read the following detailed description of the preferred embodiments, which are illustrated in the various drawing figures.

BRIEF DESCRIPTION OF THE DRAWINGS

The accompanying drawings, which are incorporated in and form a part of this specification, illustrate embodiments of the invention, and together with the description, serve to explain the principles of the invention.

DETAILED DESCRIPTION OF THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail so as not to unnecessarily obscure aspects of the present invention.

Figure 1:
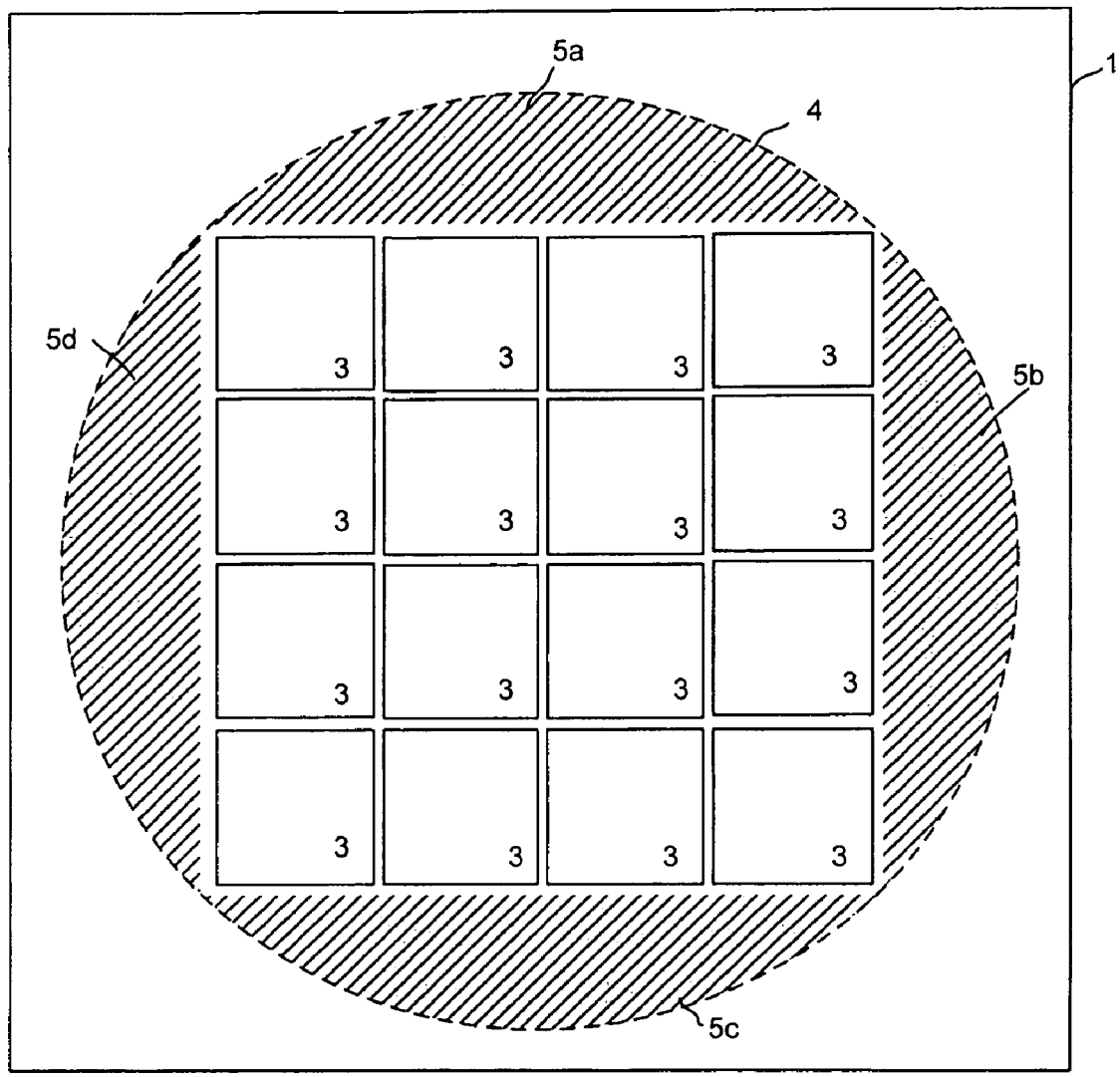
FIG. 1 is a photomask for a semiconductor fabrication process that includes die regions and blading areas that extend on the top, bottom and sides of the die regions in accordance with one embodiment of the present invention.

Referring now to FIG. 1, a photomask 1 is shown that includes die regions 3 that extend within focus region 4 of photomask 1. Die regions 3 and the scribe lines that surround each of die regions 3 form a rectangular shape that extends within the center of focus region 4, covering most of focus region 4. Blading areas 5a-5d extend from the outermost edges of the scribe lines that surround die regions 3 to the limits of focus region 4.

Figure 2:
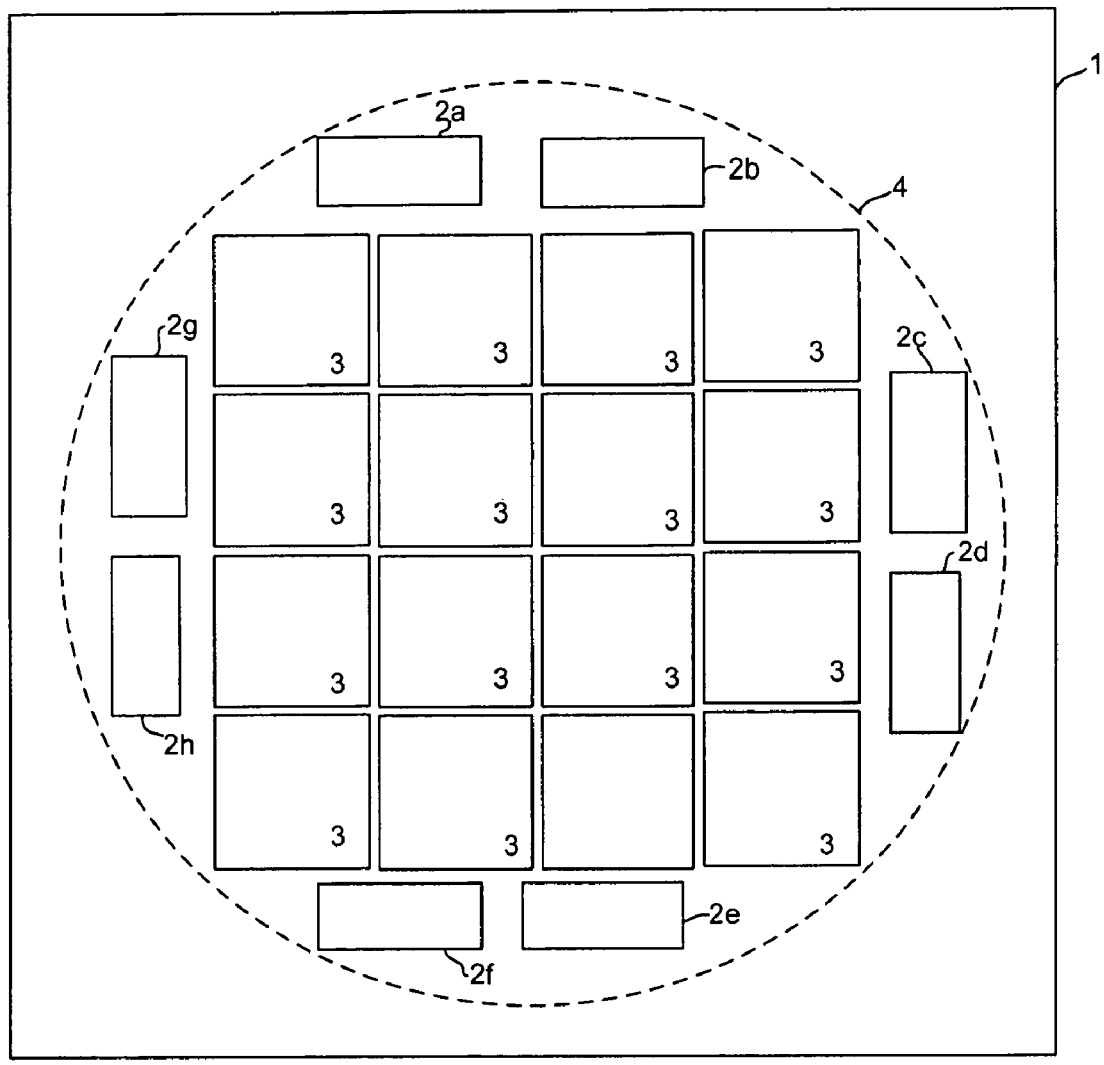
FIG. 2 is a photomask that includes die regions and test patterns that are formed in the blading areas of the photomask in accordance with one embodiment of the present invention.

In accordance with one embodiment of the present invention test patterns are formed in one or more of blading areas 5a-5d. In the embodiment shown in FIG. 2 test patterns 2a-2h are shown to be formed in blading areas 5a-5d. In the present embodiment die regions 3 define features for a process step of a semiconductor fabrication process and one or more of test patterns 2a-2h define a test pattern for a process step that is different from the process step associated with die regions 3.

In the present embodiment photomask 1 is formed by sending a layout design to a photomask vendor that includes a design layer that indicates the pattern of die regions 3. This particular layer of the layout design and the corresponding die regions 3 are associated with a specific process step in which the pattern of die regions 3 will be transferred to individual semiconductor wafers.

In the present embodiment, the layout design that is sent to the photomask manufacturer includes a design layer that includes the integrated circuit design data that defines die regions 3. In addition to the design data that defines die region 3, the design layer includes design data that defines the test patterns 2a-2h that are to be included on the photomask 1. The photomask vendor then fabricates a photomask 1 that includes both die regions 3 and test patterns 2a-h. Some of test patterns 2a-2h can be test patterns that are associated with the design layer that defines die regions 3. In one embodiment, one or more of test patterns 2a-2h are associated with a different design layer. More particularly, they are associated with a design layer that is different from the design layer that defines die regions 3. This can be a different design layer in the same layout design or a design layer of a layout design for a different product, either in the same product family or in a different product family.

Figure 3:
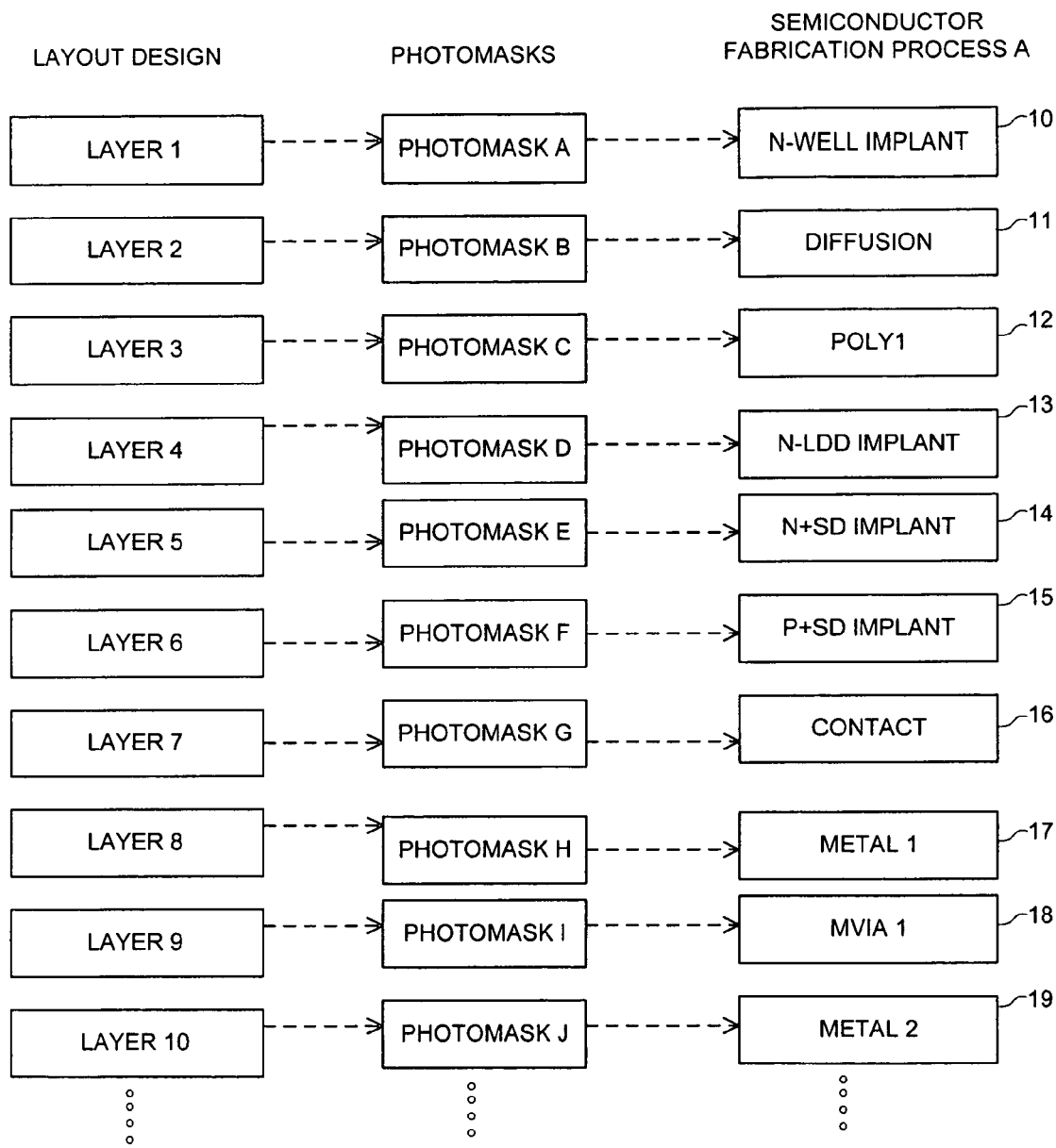
FIG. 3 is a diagram that shows some of the steps in an exemplary semiconductor fabrication process that are patterned using photomasks, and illustrates layers in a layout design that are used to form the photomasks in accordance with one embodiment of the present invention.

In the embodiment shown in FIG. 3 a layout design is shown that includes layers 1-10. Layers 1-10 include the design data that define die regions 3 for each of photomasks A-J that will be used in semiconductor fabrication process A. In semiconductor fabrication process A, semiconductor wafers are subjected to process steps 10-19, with each process step performed sequentially on a particular semiconductor wafer so as to produce a complete production wafer. The production wafer will include numerous die regions, each of which reflects the patterns transferred from photomasks A-J. More particularly, the first layer of the layout design (layer 1) includes the integrated circuit design data that defines the pattern of die regions 3 on photomask A; where photomask A is used for patterning process step 10. A second layer of the layout design (layer 2) includes the integrated circuit design data that defines the pattern of die regions 3 on photomask B; where photomask B is used for patterning process step 11. Accordingly, process step 10 is the process step associated with layer 1 and associated with photomask A. Similarly, process step 11 is the process step associated with layer 2 and with photomask B.

Layer 3 defines the pattern of die regions 3 on photomask C that are used for patterning process step 12; layer 4 defines the pattern of die regions 3 on photomask D that are used for patterning process step 13; layer 5 defines the pattern of die regions 3 on photomask E that are used for patterning process step 14; layer 6 defines the pattern of die regions 3 on photomask F that are used for patterning process step 15; layer 7 defines the pattern of die regions 3 on photomask G that are used for patterning process step 16. Similarly, layer 8 defines the pattern of die regions 3 on photomask H that are used for patterning process step 17; layer 9 defines the pattern of die regions 3 on photomask I that are used for patterning process step 18; and layer 10 defines the pattern of die regions 3 on photomask J that are used for patterning process step 19.

In the present embodiment, process step 10 is process step in which N-wells are formed on a semiconductor substrate, with the pattern of the N-wells defined by die regions 3 on photomask A. In process step 11, diffusion regions are formed that have a pattern defined by die regions 3 of photomask B. In process step 12 a polysilicon layer is etched such that it has a pattern defined by die regions 3 of photomask C. In process step 13 a Lightly Doped Drain (LDD) implant is performed to form LDD regions that have a pattern defined by die regions 3 of photomask D. In process step 14 an N+ implant is performed to form source and drain regions that have a pattern defined by die regions 3 of photomask E. In process step 15 a P+ implant is performed to form source and drain regions that have a pattern defined by die regions 3 of photomask F. In process step 16 contact openings are formed that have a pattern defined by die regions 3 of photomask G. In process step 17 a first metal layer is etched to form a first metal layer that has a pattern defined by die regions 3 of photomask H. In process step 18 via openings are formed that have a pattern defined by die regions 3 of photomask I. In process step 19 a second metal layer is etched to form a second metal layer that has a pattern defined by die regions 3 of photomask J.

Test patterns 2a-h are used in the semiconductor fabrication process for generating test die. In one embodiment the process steps that are used to form the test die are the same process steps that are used to form the production semiconductor die. This allows for testing different layout designs and the structures resulting from those layout designs. For example, in the embodiment shown in FIG. 3, test patterns 2a-2h on photomasks A-J are selectively exposed so as to transfer the design to be tested to the semiconductor wafer such that process steps 10-19 form corresponding test die that include the structures to be tested. In the present embodiment the pattern for of each of process steps 10-19 is defined by exposing a test pattern 2a-2h on a layer of resist that is developed to form a masking structure having the test pattern 2a-2h. This exposure process can be performed by covering (blading) all of the photomask A-J except for that portion of the photomask A-J that includes the test pattern 2a-2h that is to be exposed. The process step 10-19 is then performed so as to form the desired structure.

Figure 4:
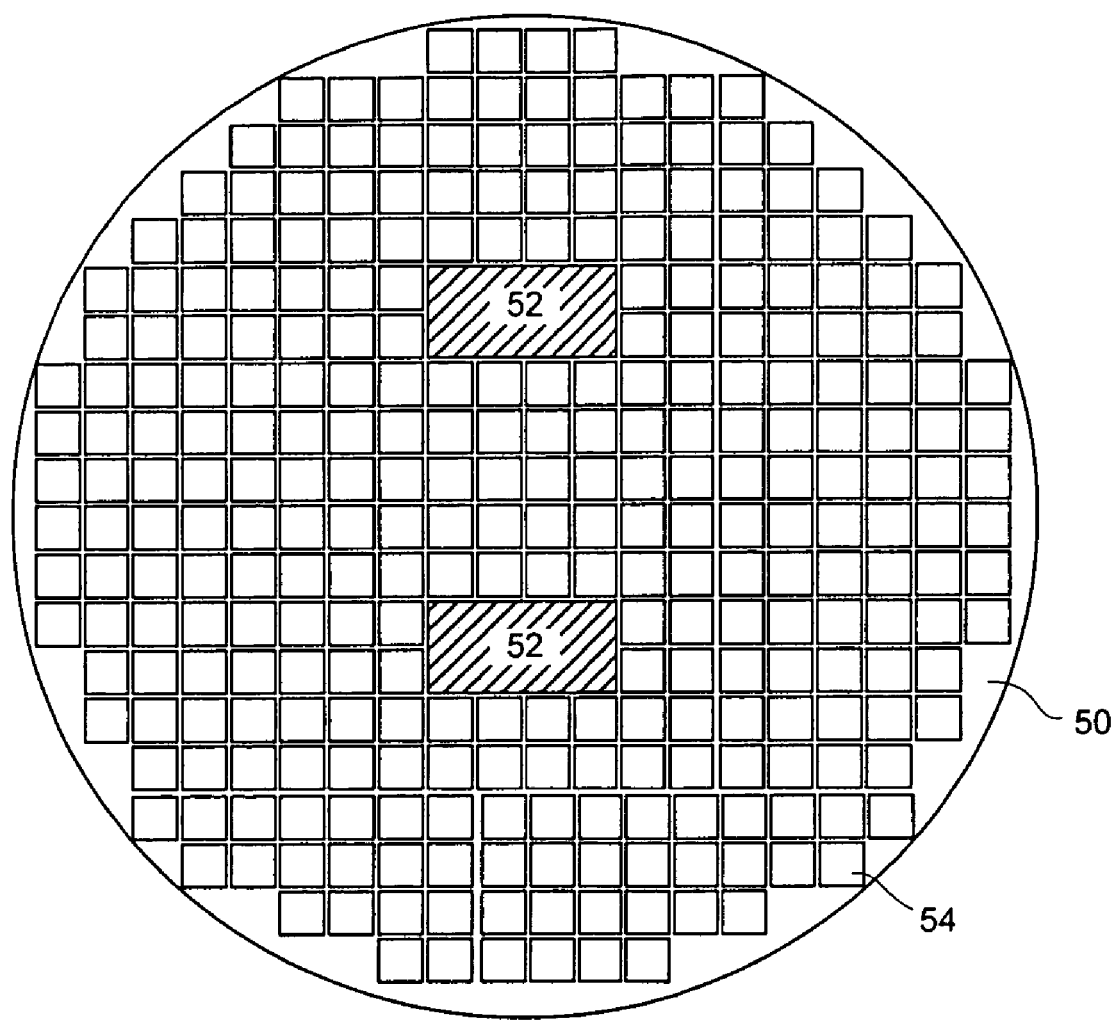
FIG. 4 is a top view of a semiconductor wafer having production die regions formed thereover and having test die formed thereover in accordance with one embodiment of the present invention.
Figure 5:
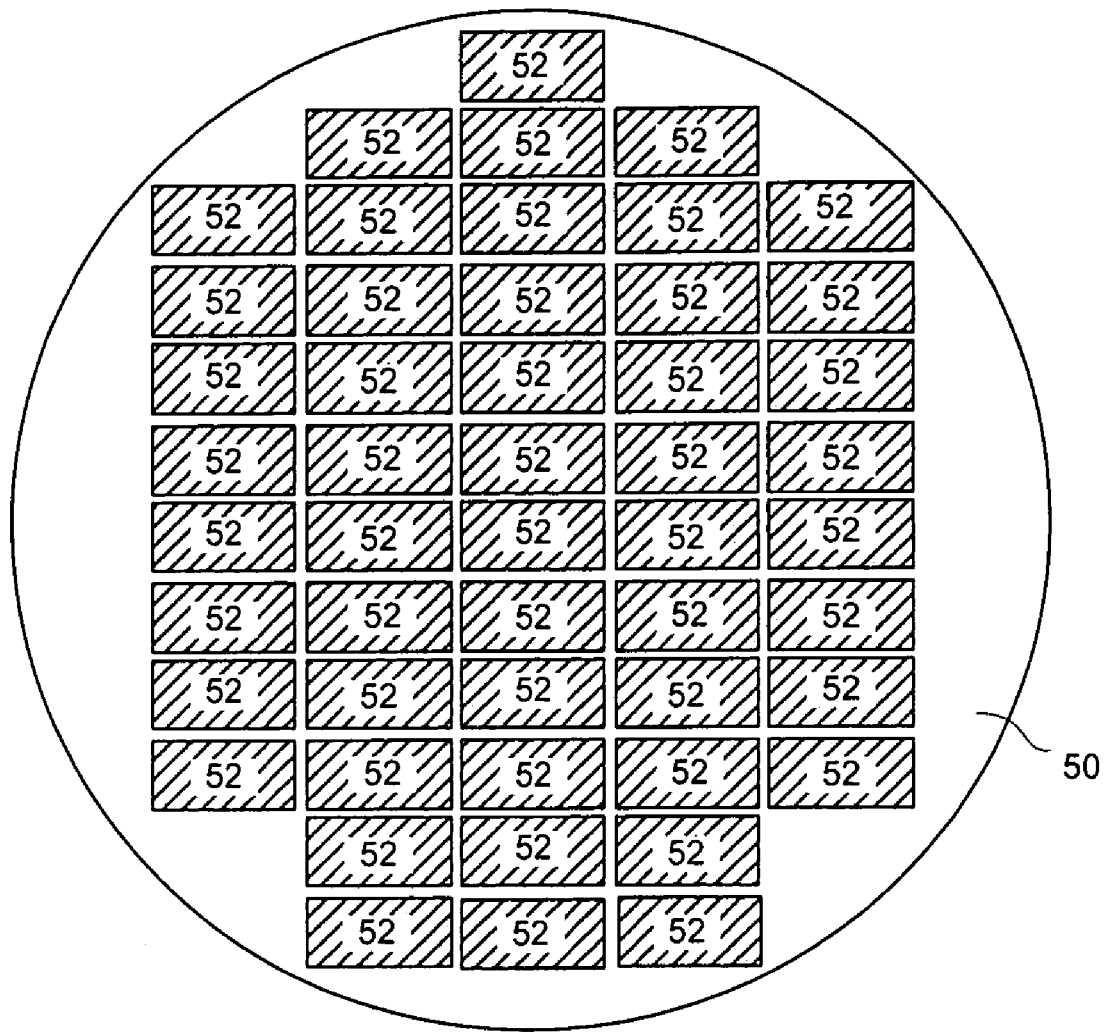
FIG. 5 is a top view of a semiconductor wafer having only test die formed thereover in accordance with one embodiment of the present invention.

Referring now to FIGS. 4-5, test die 52 are formed along with production die as wafers move through the semiconductor fabrication process. More particularly, die regions 3 are exposed using a stepper that repeats the pattern of die regions 3 so as to transfer the pattern to corresponding die regions 54 on a semiconductor wafer 50 prior to each of process steps 10-19. This exposure can be used to activate a resist layer that is subsequently developed to form a masking structure having the desired pattern. The process step 10-19 is then performed, producing the desired structure in die region 54.

Test die 52 are formed by selectively exposing test patterns 2a-2h on photomasks A-J prior to the process step 10-19 that is to be formed on test die 52. This exposure can be used to activate a resist layer that is subsequently developed to form a masking structure having the desired pattern. Any of photomasks A-J can be used that have a sufficient mask grade for the particular process steps to be performed. Moreover, higher or lower grades of photomask can be used to test usage of different mask grades.

In the embodiment shown in FIG. 4, both production die 54 and test die 52 are formed on the same semiconductor wafer. This allows for easily forming test die 52 using production semiconductor wafers. However, in this embodiment, when a process is required to be performed on test die 52 and not die regions 54 the substrate must be masked so as to cover die regions 54 while the particular process step is being performed. Similarly, when a process step must be performed on die regions 54 and not on test die 52, the substrate must be masked to cover test die 52. Accordingly, additional masking steps must be added to the fabrication process.

In another embodiment that is shown in FIG. 5, test die 52 are formed on a dedicated test wafer 50. In this embodiment, only test die 52 are formed on test wafer 50, with production wafers formed that include only production die regions 54. Whenever possible, the processing steps performed on dedicated test wafer 50 are performed in the same process chamber as is used for production wafers by including dedicated test wafer 50 in the process lot such that structures are formed on test die 52 and production die regions at the same time. By separating processing of production wafers from test wafers more test die 52 can be formed on a particular semiconductor wafer. In addition, there is no need to perform masking steps that are required when different process steps are used to form the test die than are used to form the production die.

In one embodiment, test die 52 is formed using the same process steps 10-19 that are used to form the production die 54. In this embodiment some of the test patterns 2a-2h that are used to form test die 52 are test patterns 2a-2h that are associated with a process step 10-19 that is different from the process step 10-19 associated with the photomask A-J. In the embodiment shown in FIG. 6, as shown by arrows 40a-g, some of the structures on test die 52 are formed using a test patterns 2a-2h that is associated with a process step that is the same process step associated with the photomask A, C-F and I-J that is used. As shown by arrows 41a-c other structures on test die 52 are formed using a test pattern 2a-2h that is associated with a process step that is different from the process step associated with the photomask A, F and G that is used.

Figure 6:
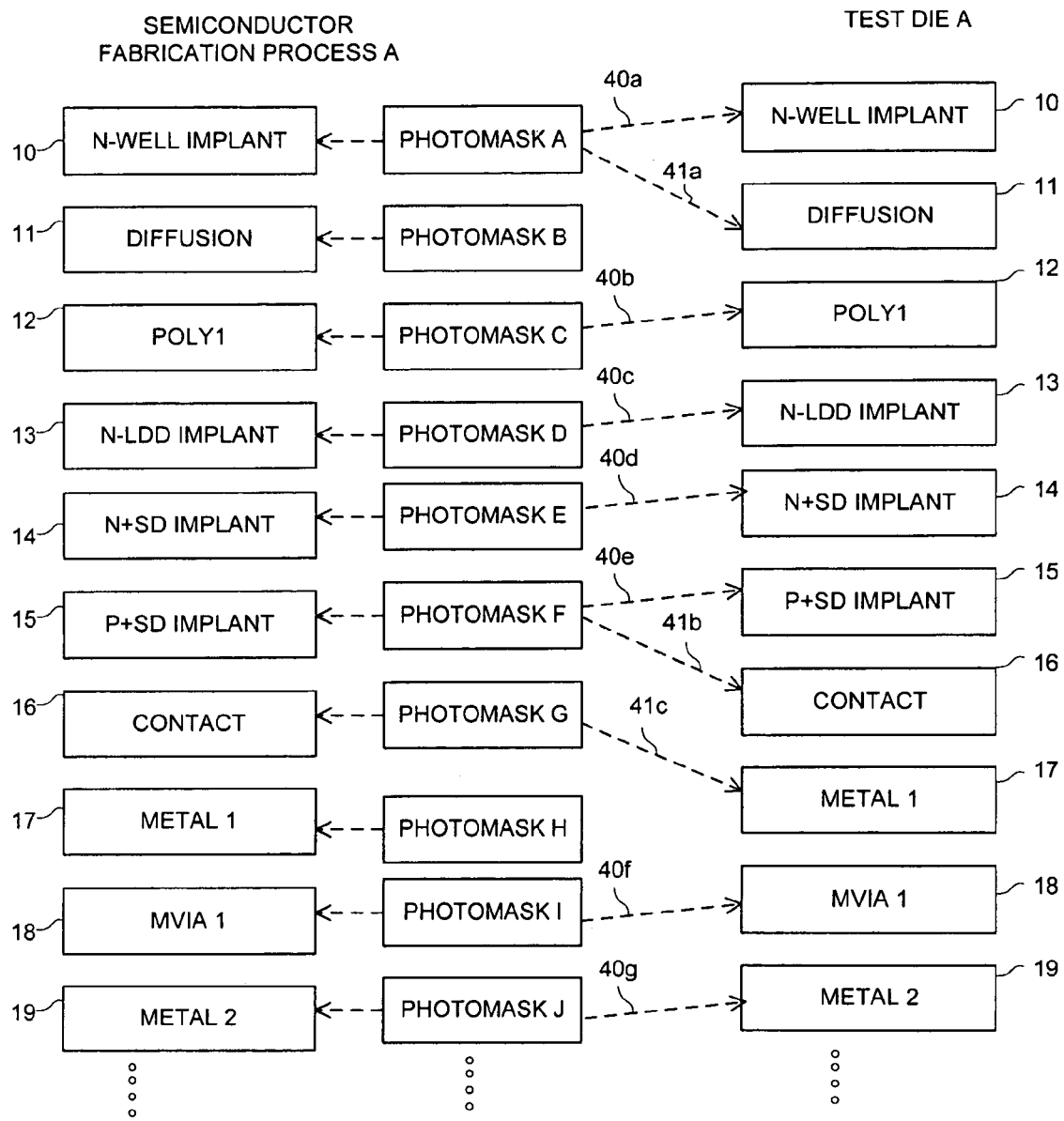
FIG. 6 is a diagram that illustrates a method for forming a test die in which the process steps that are used for forming the test die are the same process steps that are used in the semiconductor fabrication process in accordance with one embodiment of the present invention.

Continuing with FIG. 6, photomask A (that is associated with process step 10) includes a first test pattern (e.g., test pattern 2a) that is associated with process step 10 and a second test pattern (e.g., test pattern 2b) that is associated with process step 11. As shown by arrow 40a, an N-well implant structure is formed in die region 52 using a test pattern 2a that is associated with a process step 10. More particularly, a test pattern 2a on photomask A is exposed to define a pattern for N-well implant process step 10. This pattern can be formed by exposing and developing a layer of resist. Process step 10 is then performed, forming N-well structures on test die 52. In one embodiment, die regions 3 of photomask A are exposed on die regions 54 prior to performing process step 10, with process step 10 performed simultaneously on die regions 52 and 54. This forms structures in production die 54 and in test die 52 at the same time, with the structures either formed on the same semiconductor wafer (FIG. 4) or on different wafers (FIG. 5).

Referring now to arrow 41a, test pattern 2b on photomask A is exposed to define a pattern for diffusion process step 11. This pattern can be formed by exposing and developing a layer of resist. Process step 11 is then performed, forming diffusion structures on test die 52. In one embodiment, die regions 3 of photomask B are exposed on die regions 54 prior to performing process step 11, with process step 11 performed simultaneously on die regions 52 and 54. This forms structures in production die 54 and in test die 52 at the same time, with the structures either formed on the same semiconductor wafer (FIG. 4) or on different wafers (FIG. 5). By forming a diffusion structure as shown by arrow 41a using a test pattern 2b that is associated with a process step 11 that is different from the process step 10 associated with photomask A, more test structures can be formed using a particular photomask or set of photomasks. More particularly, as only test pattern 2a and 2b on photomask A are used for process steps 10-11, the remaining test patterns 2c-2h on photomask A, and test patterns 2a-2h on photomask B are available for forming other test die.

As indicated by arrow 40b, a test pattern (e.g., test pattern 2a) that is associated with a process step 12 is used to form a test structure on semiconductor wafer 50. More particularly, a test pattern 2a on photomask C is exposed to define a pattern for process step 12. This pattern can be formed by exposing and developing a layer of resist. Process step 12 (e.g., an etch process) is then performed, forming polysilicon structures on test die 52. In one embodiment, die regions 3 of photomask C are exposed on die regions 54 prior to performing process step 12, with process step 12 performed simultaneously on die regions 52 and 54. This forms structures in production die 54 and in test die 52 at the same time, with the structures either formed on the same semiconductor wafer (FIG. 4) or on different wafers (FIG. 5). Moreover, as only test pattern 2a on photomask C is used for process step 12, the remaining test patterns 2b-2h are available for forming other test die.

As shown by arrow 40c, a test pattern (e.g., test pattern 2a on photomask D) that is associated with a process step 13 is exposed to define a pattern for process step 13. N+ implant process step 13 is then performed so as to form Lightly Doped Drain (LDD) implant regions in die region 52. As shown by arrow 40d a test pattern (e.g., test pattern 2a on photomask E) that is associated with process step 14 is exposed to define a pattern for process step 14. Process step 14 is then performed so as to form N+ source and drain structures in die region 52. Referring now to arrow 40e, a test pattern (e.g., test pattern 2a on photomask F) that is associated with a process step 15 is exposed to define a pattern for process step 15. Process step 15 is then performed so as to form P+ source and drain structures in die region 52.

Contact openings are then formed in die region 52 using a test pattern (e.g., test pattern 2b on photomask F) to define a pattern for process step 16 (e.g., by exposing and developing a layer of resist). Etch process step 16 is then performed, forming contact openings on test die 52. In one embodiment, die regions 3 of photomask G are exposed on die regions 54 prior to performing process step 16, with process step 16 performed simultaneously on die regions 52 and 54. This forms structures in production die 54 and in test die 52 at the same time, with the structures either formed on the same semiconductor wafer (FIG. 4) or on different wafers (FIG. 5). By forming contact openings as shown by arrow 41b using a test pattern 2b that is associated with a process step 16 that is different from the process step 15 that photomask F is associated with, more test structures can be formed using a particular photomask or set of photomasks. More particularly, as only test pattern 2a on photomasks D-E and test patterns 2a and 2b on photomask F are used for process steps 13-16, the remaining test patterns 2b-2h on photomasks D-E, and test patterns 2c-2h on photomask F are available for forming other test die.

Referring now to arrow 41c, the first metal layer is formed in die region 52 using a test pattern (e.g., test pattern 2b on photomask G) that is associated with a process step 17 that is different from process step 16 that photomask G is associated with. In the present embodiment, test pattern 2b on photomask G is exposed to define a pattern for process step 17 (e.g., by exposing and developing a layer of resist). Etch process step 17 is then performed, forming contact openings on test die 52. In one embodiment, die regions 3 of photomask H are exposed on die regions 54 prior to performing process step 17, with process step 17 performed simultaneously on die regions 52 and 54. This forms structures in production die 54 and in test die 52 at the same time, with the structures either formed on the same semiconductor wafer (FIG. 4) or on different wafers (FIG. 5).

The test die fabrication process then continues as shown by arrows 40f-g, with vias formed in etch process step 18 and a second metal layer patterned in process step 19, and the remaining process steps performed, so as to form a complete test die A. In the formation of test die A, only a single test pattern 2a on each of photomasks C-E, G, I and J is used, leaving all of the remaining test patterns on the photomask D-F that can be used for forming other test die. Also, all of the test patterns 2a-2h on photomasks B and H can be used for forming other test die. Moreover, all of the remaining test patterns on photomasks A and F can be used to form other test die.

In one embodiment only some of process steps 10-19 are performed on test die 52, forming test structures on the surface of test die 52. For example, in one exemplary embodiment test die 52 is removed from semiconductor fabrication process A after process step 10 has been performed and is immediately analyzed. After the analysis has been completed semiconductor fabrication process A is continued by performing process steps 11-19 to form complete die regions 54 on semiconductor wafer 50.

Figure 7:
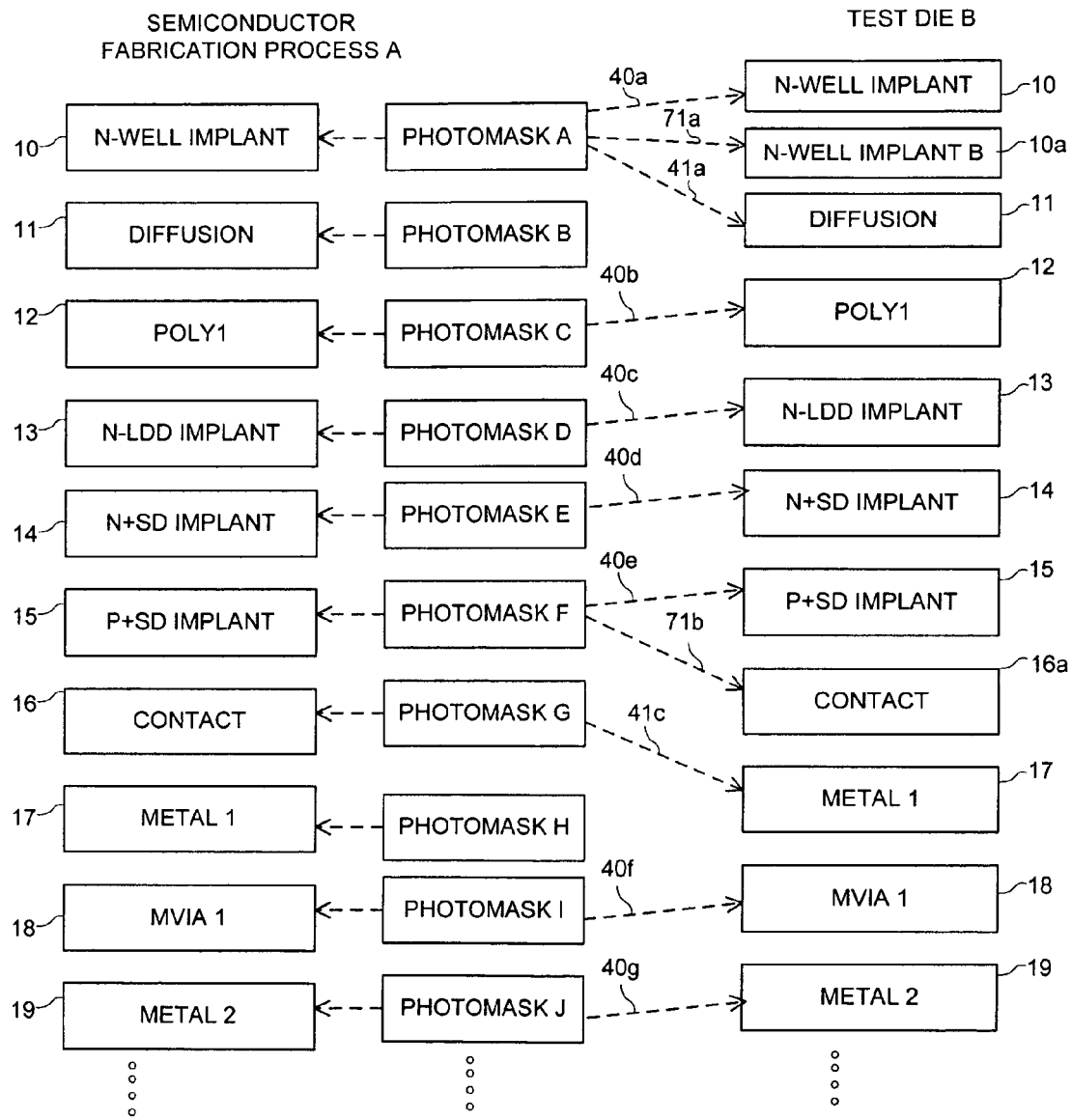
FIG. 7 is a diagram that illustrates a method for forming a test die in which the process steps that are used for forming the test die include process steps that are different from the process steps that are used in the semiconductor fabrication process in accordance with one embodiment of the present invention.

Test die can be formed using process steps that are different from the process steps 10-19 that are used in semiconductor fabrication process A. This allows for testing both the effects of different circuit designs and different processes. In the embodiment shown in FIG. 7, process steps 10a and 16a are used to form a test die B, where process steps 10 a and 16a are different from any of process steps 10-19 in semiconductor fabrication process A. Test die B can be formed on the same semiconductor substrate 50 as test die A or on a different semiconductor substrate 50.

As shown by arrow 71a, a test pattern (e.g., test pattern 2c on photomask A) is used to define a pattern for process step 10a (which is different from process step 10). In the present embodiment process step 10a is an additional implantation process step that forms an N-well implant region in test die 52. When both the test die A and test die B are formed, test patterns 2a-2b on photomask A will be used to form test die A and test pattern 2c will be used to form test die B. This leaves test patterns 2d-2h on photomask A that can be used for forming other test die.

Referring now to arrow 71b, a test pattern on photomask F is used to define a pattern for process step 16a. In the present embodiment, process step 16a is an etch process (that uses a different etchant from process step 16) to form contact openings in a dielectric layer. The test pattern on photomask F that is used to pattern the contact openings can either be the same test pattern 2b on photomask F that is used to form the contact patterns for test die A or can be a different test pattern (e.g., test pattern 2c on photomask F).

Figure 8:
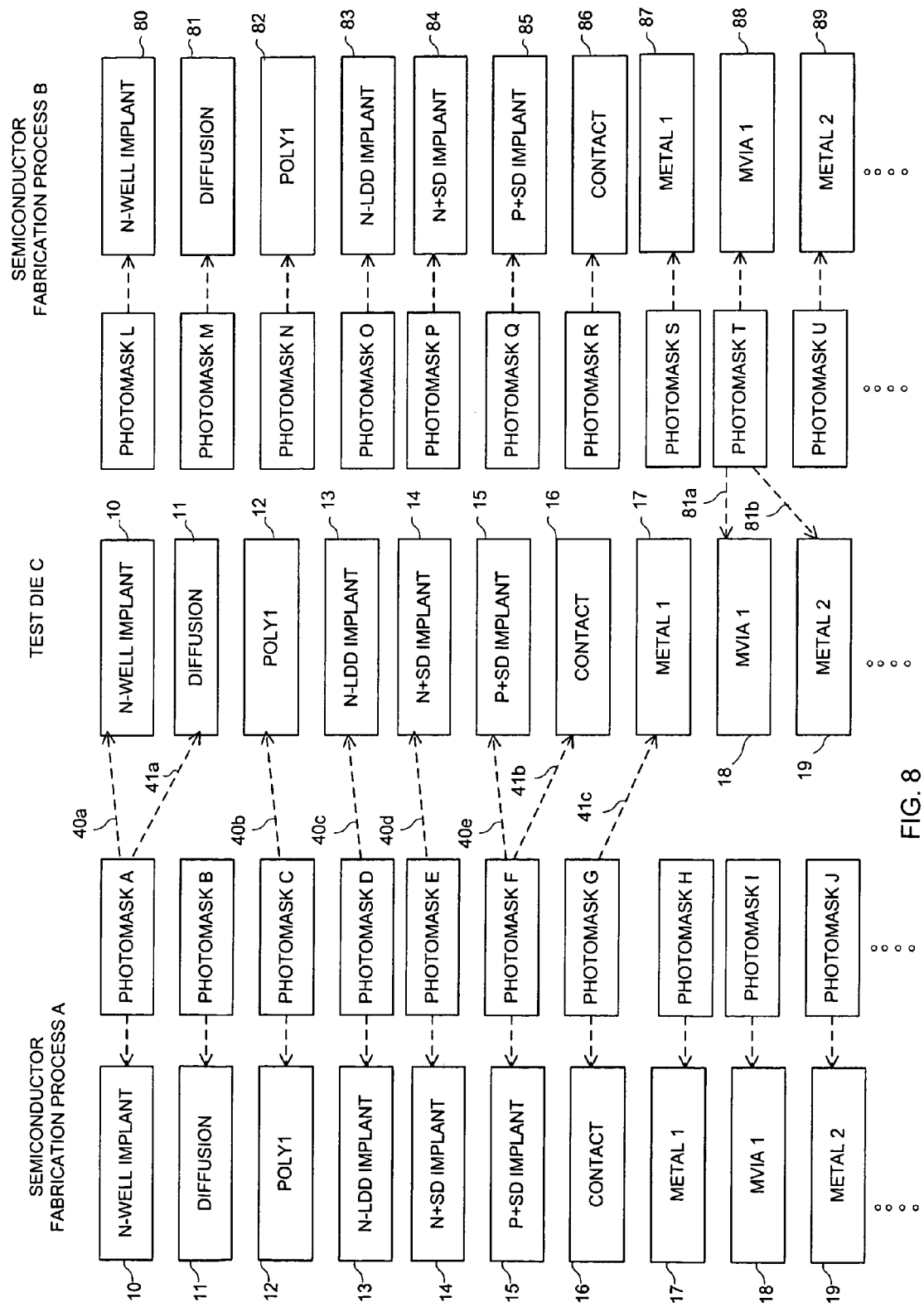
FIG. 8 is a diagram that shows the semiconductor fabrication process of FIG. 3 and a different semiconductor fabrication process in which photomasks L-U are used to form patterns for semiconductor fabrication process steps 80-89, and that illustrates a method for forming a test die in which photomasks from both processes are used to define the test patterns in accordance with one embodiment of the present invention.

Referring now to FIG. 8, test die 52 can also be formed using test patterns from photomasks of different semiconductor manufacturing processes. By utilizing photomasks from different semiconductor fabrication processes to form test die, the present invention allows for more test die to be formed using the same sets of photomasks that are used in the semiconductor fabrication processes.

In the embodiment shown in FIG. 8, a test die 52 is formed using some photomasks from a first semiconductor fabrication process (process A) and some photomasks from an entirely different semiconductor manufacturing process (process B). Semiconductor manufacturing processes A and B form different products, that can either be similar products (e.g., two different types of clock products) or can be entirely different product lines (e.g., a memory product and a clock product).

In the present embodiment the same test patterns on photomasks A and B-G that were used to form test die A in FIG. 6 are used to form corresponding structures on test die C. However, in addition, die regions from photomask T of process B are used to define patterns for process steps 18-19. More particularly, as shown by arrow 81a, a test pattern (e.g., test pattern 2a) on photomask T is exposed so as to define a pattern for etch process step 18 that defines vias in a dielectric layer. As shown by arrow 81b, a test pattern (e.g., test pattern 2b) on photomask T is exposed so as to define a pattern for etch process step 18 that patterns the second metal layer.

By utilizing blading areas of a photomasks and test patterns that are not associated with the same process step that the photomask is associated with, the methods and apparatus of the present invention allow for more test die to be formed using a particular set of photomasks. Also, by utilizing photomasks from different semiconductor fabrication processes to form test die, even more test die can be formed. Moreover, by increasing the number of test die that can be formed using available photomasks, the present invention allows for generation of additional test die without the need to generate additional photomasks for testing purposes.

The preferred embodiment of the present invention is thus described. While the present invention has been described in particular embodiments, it should be appreciated that the present invention should not be construed as limited by such embodiments, but rather construed according to the following claims.

What is claimed is:

1. A method for forming test structures comprising:
   patterning a resist layer on a first semiconductor substrate to form a resist structure within production die regions of the first semiconductor substrate, the resist layer patterned by exposing portions of a photomask that includes a plurality of identical die regions configured to a design layer of a semiconductor design and a test pattern configured to a different design layer of a semiconductor design, the identical die regions disposed in a rectangular shape that covers most of the focus region and the test pattern disposed in a blading area of the photomask, wherein all of the identical die regions are exposed and the test pattern is not exposed; and patterning a resist layer on a second semiconductor substrate by exposing only the test pattern of the photomask to transfer the test pattern to a test die region of the second semiconductor substrate and exposing die regions from a different photomask to pattern production die regions of the second semiconductor substrate.

2. The method of claim 1 wherein patterning a resist layer on a first semiconductor substrate includes developing the resist layer on the first semiconductor substrate and patterning a resist layer on a second semiconductor substrate includes developing the resist layer on the second semiconductor substrate to form a test structure in the test die region and form different structures in the production die regions.

3. A method as recited in claim 2 further comprising:
performing a first process step on the first semiconductor substrate and performing a second process step that is different from the first process step on the second semiconductor substrate.

4. A method as recited in claim 3 wherein the second process step is a process step in a semiconductor fabrication process that forms a product, and wherein the second process step is a different process in the fabrication of the product.

5. A method as recited in claim 2 wherein the photomask includes a different test pattern formed in the blading area of the photomask, the patterning a resist layer on a second semiconductor substrate further comprising exposing the different test pattern prior to the developing the resist layer on the second semiconductor substrate to define features of an additional test die region on the second semiconductor substrate.

6. A method as recited in claim 1 wherein the photomask has a grade that is different from the grade of the different photomask.

7. A method as recited in claim 1 wherein the test pattern is configured to a design layer of a semiconductor design that forms a product that is different from the product formed by the identical die regions.

8. A method for forming test structures comprising:
patterning a resist layer on a first semiconductor substrate to form a resist structure within production die regions of the first semiconductor substrate, the resist layer patterned by exposing portions of a photomask that includes a plurality of identical die regions configured to a design layer of a semiconductor design and a test pattern configured to a different design layer of a semiconductor design, the identical die regions disposed in a rectangular shape that covers most of the focus region and the test pattern disposed in a blading area of the photomask, wherein all of the identical die regions are exposed and the test pattern is not exposed; and patterning a resist layer on a second semiconductor substrate by exposing only the test pattern of the photomask to transfer the test pattern to a test die region of the second semiconductor substrate and exposing die regions from a different photomask to pattern other test die regions of the second semiconductor substrate.

9. A method as recited in claim 8 wherein the identical die regions form patterns in production die regions of the first semiconductor substrate, the method further comprising performing a first process step on the first semiconductor substrate and performing a second process step that is different from the first process step on the second semiconductor substrate.

10. A method as recited in claim 9 wherein the photomask includes a different test pattern that is formed in a blading area of the photomask.

11. A method as recited in claim 10 wherein the first semiconductor substrate includes only production die regions and wherein the second semiconductor substrate includes only the test die regions.

12. A method as recited in claim 9 wherein the semiconductor fabrication process forms a product, and wherein the second process step is a different process in the fabrication of a different product.

13. A method as recited in claim 8 wherein patterning a resist layer on a first semiconductor substrate includes developing the resist layer on the first semiconductor substrate and patterning a resist layer on a second semiconductor substrate includes developing the resist layer on the second semiconductor substrate to form a test structure in the test die region and form different structures in the other test die regions.

14. A method as recited in claim 8 wherein the first photomask has a grade that is different from the grade of the different photomask.

15. A method for forming test structures comprising:
patterning a resist layer on a first semiconductor substrate to form a resist structure within production die regions of the first semiconductor substrate, the resist layer patterned by exposing portions of a photomask that includes a plurality of identical die regions configured to a design layer of a semiconductor design and a test pattern configured to a different design layer of a semiconductor design, the identical die regions disposed in a rectangular shape that covers most of the focus region and the test pattern disposed in a blading area of the photomask, wherein all of the identical die regions are exposed and the test pattern is not exposed, the photoresist on the first semiconductor substrate developed to form resist structures in the production die regions; and patterning a resist layer on a second semiconductor substrate by exposing only the test pattern of the photomask to transfer the test pattern to a test die region of the second semiconductor substrate and exposing die regions from a different photomask to pattern other die regions of the second semiconductor substrate, the resist layer on the second semiconductor substrate developed to form a test structure in the test die region and form different structures in the other die regions.

16. The method of claim 15 further comprising performing a first process step on the first semiconductor substrate and performing a second process step that is different from the first process step on the second semiconductor substrate.

17. A method as recited in claim 15 wherein the photomask has a grade that is different from the grade of the different photomask.

18. A method as recited in claim 17 wherein the photomask includes an additional test pattern formed in the blading area of the photomask.

* * * * *